(12) United States Patent
Liu et al.

(10) Patent No.: US 10,411,118 B2
(45) Date of Patent: Sep. 10, 2019

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yan Liu, Shanghai (CN); Jia Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/970,565

(22) Filed: May 3, 2018

(65) Prior Publication Data

US 2018/0323287 A1  Nov. 8, 2018

(30) Foreign Application Priority Data

May 5, 2017 (CN) .......................... 2017 1 0313105

(51) Int. Cl.
*H01L 21/00* (2006.01)
*H01L 27/00* (2006.01)
(Continued)

(52) U.S. Cl.
CPC .. *H01L 29/66772* (2013.01); *H01L 21/28105* (2013.01); *H01L 21/823425* (2013.01);
(Continued)

(58) Field of Classification Search
CPC ....... H01L 21/823864; H01L 21/28105; H01L 21/823842; H01L 21/76224;
(Continued)

(56) References Cited

U.S. PATENT DOCUMENTS 8,334,185 B2 *  12/2012  Kronholz ........ H01L 21/823807
 257/E21.431
8,936,987 B2 *   1/2015  Liu ..................... H01L 29/7848
 438/299

(Continued)

*Primary Examiner* — Nikolay K Yushin
(74) *Attorney, Agent, or Firm* — Anova Law Group, PLLC (57) ABSTRACT

A method for fabricating a semiconductor structure includes providing a substrate, forming a plurality of gate electrodes on the substrate, forming a plurality of first sidewall spacers on the side surfaces of the plurality of gate electrodes, forming an oxide layer on the substrate, and forming a plurality of second sidewall spacers on the oxide layer covering the side surfaces of the plurality of first sidewall spacers. Each gate electrode, first sidewall spacers formed on the side surfaces of the gate electrode, and second sidewall spacers formed on the side surfaces of the first sidewall spacers together form a gate structure. The method includes forming an undercut, having an undercut angle made between the oxide layer and the substrate under each second sidewall spacer, and forming a plurality of grooves through the oxide layer and into the substrate. Each groove includes undercuts under second sidewall spacers of adjacent gate structures.

20 Claims, 6 Drawing Sheets

(51) Int. Cl.
- *H01L 29/00* (2006.01)
- *H01L 29/66* (2006.01)
- *H01L 29/49* (2006.01)
- *H01L 29/78* (2006.01)
- *H01L 21/8238* (2006.01)
- *H01L 21/28* (2006.01)
- *H01L 29/423* (2006.01)
- *H01L 21/8234* (2006.01)
- *H01L 27/088* (2006.01)
- *H01L 29/165* (2006.01)

(52) U.S. Cl.
CPC ........... *H01L 21/823842* (2013.01); *H01L 21/823864* (2013.01); *H01L 27/088* (2013.01); *H01L 29/42384* (2013.01); *H01L 29/4983* (2013.01); *H01L 29/6653* (2013.01); *H01L 29/6656* (2013.01); *H01L 29/66636* (2013.01); *H01L 29/785* (2013.01); *H01L 29/7848* (2013.01); *H01L 21/823412* (2013.01); *H01L 21/823468* (2013.01); *H01L 29/165* (2013.01)

(58) Field of Classification Search
CPC ........... H01L 21/76232; H01L 27/1203; H01L 27/115; H01L 27/10688; H01L 29/66772; H01L 29/4983; H01L 29/785; H01L 29/42384; H01L 21/823425; H01L 21/823412; H01L 21/823468; H01L 29/0649; H01L 29/66272; H01L 29/66553; H01L 29/66545; H01L 29/6653; H01L 29/66636; H01L 29/7848; H01L 29/6656; H01L 29/165; H01L 27/124; H01L 27/1292; H01L 27/088; H01L 27/1068

See application file for complete search history.

(56) References Cited

U.S. PATENT DOCUMENTS

2012/0267683 A1* 10/2012 Kronholz ........ H01L 21/823807
257/192
2014/0361339 A1* 12/2014 Liu ................... H01L 29/7848
257/192

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201710313105.6, filed on May 5, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the rapid development of semiconductor technology, the feature size of semiconductor structures is continuously reduced, and the integration level of integrated circuits (ICs) becomes higher and higher. Accordingly, the requirements on the performance of the devices may also be higher.

Currently, with the dimension of metal-oxide-semiconductor field-effect transistor (MOSFET) continuously becoming smaller, the channel length in MOSFET devices may have to be reduced in order to accommodate the reduction of the process node. The reduction of the channel length may be conducive to increasing the density of the transistors in the chip, improving the switching speed of the MOSFET devices.

However, as the channel length of devices decreases, the distance between the source region and the drain region may also be reduced. As a result, the ability of the gate structure in controlling the channel may be degraded, and thus pinching off the channel by the gate may be more and more difficult. Therefore, the sub-threshold leakage phenomenon, i.e., the short-channel effect (SCE), becomes a crucial technical challenge and needs to be resolved.

In order to accommodate the requirements for scaling-down semiconductor devices, semiconductor process gradually switches from planar MOSFET devices to more efficient three-dimensional (3D) transistor devices, such as a fin field-effect transistor (Fin-FET) device, which demonstrates desired ability in controlling the channels.

However, the electrical performance of the conventional semiconductor structures may still need to be improved. The disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a substrate, forming a plurality of gate electrodes on the substrate, forming a plurality of first sidewall spacers on the side surfaces of the plurality of gate electrodes, forming an oxide layer on the substrate after forming the plurality of first sidewall spacers, and forming a plurality of second sidewall spacers on the oxide layer covering the side surfaces of the plurality of first sidewall spacers. Each gate electrode, first sidewall spacers formed on the side surfaces of the gate electrode, and second sidewall spacers formed on the side surfaces of the first sidewall spacers together form a gate structure. The method further includes forming an undercut, having an undercut angle made between the oxide layer and the substrate under each second sidewall spacer, and forming a plurality of grooves through the oxide layer and into the substrate. Each groove includes undercuts under second sidewall spacers of adjacent gate structures.

Another aspect of the present disclosure provides a semiconductor structure. The semiconductor structure includes a substrate, a plurality of gate electrodes formed on the substrate, a plurality of first sidewall spacers formed on side surfaces of each gate electrode, and an oxide layer formed on the substrate between first sidewall spacers of adjacent gate electrodes. An undercut is formed at a bottom of the oxide layer having an undercut angle with the substrate. The semiconductor structure also includes a plurality of second sidewall spacers, formed on the oxide layer and covering side surfaces of the plurality of first sidewall spacers. Each gate electrode, first sidewall spacers formed on the side surfaces of the gate electrode, and second sidewall spacers formed on the side surfaces of the first sidewall spacers together form a gate structure. The semiconductor structure further includes a plurality of grooves formed in the oxide layer and the substrate. Each groove includes undercuts under second sidewall spacers of adjacent gate structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
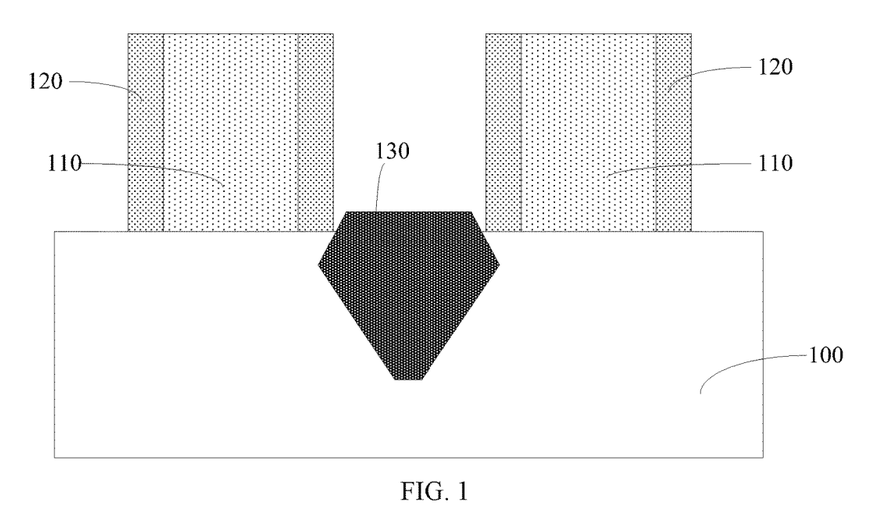
FIG. 1 illustrates a schematic view of a semiconductor structure.

FIG. 1 illustrates a schematic cross-section view of a semiconductor structure. Referring to FIG. 1, the semiconductor structure includes a substrate 100, a plurality of gate electrodes 110 formed on the substrate 100, a plurality of sidewall spacers 120 formed on both side surfaces of each gate electrode 110, a plurality of doped source/drain epitaxial layers 130 formed in the substrate 100 on the two opposite sides of each gate electrode 110.

The plurality of doped source/drain epitaxial layers 130 may be formed by a process including forming a plurality of grooves (not shown) in the substrate 100 on the two opposite sides of each gate electrode 110 by etching, and then filling up the plurality of grooves to form the plurality of doped source/drain epitaxial layers 130. Because the stress in the doped source/drain epitaxial layers 130 is relatively small, and the distance between each doped source/drain epitaxial layer 130 and the channel of the semiconductor structure is large, the resistance of the doped source/drain epitaxial layers 130 may be large. Therefore, the electrical performance of the semiconductor structure may need to be improved.

Figure 9:
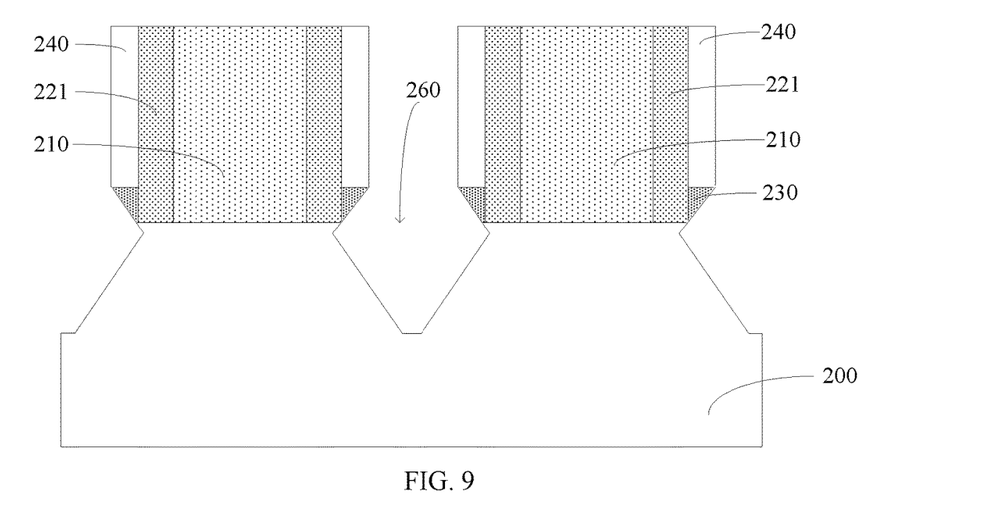
Figure 10:
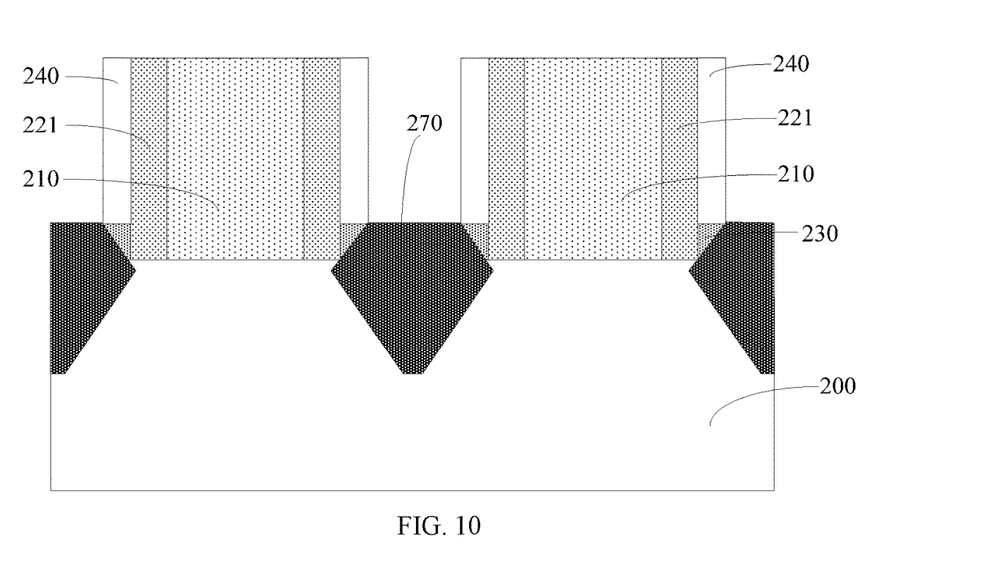
Figure 11:
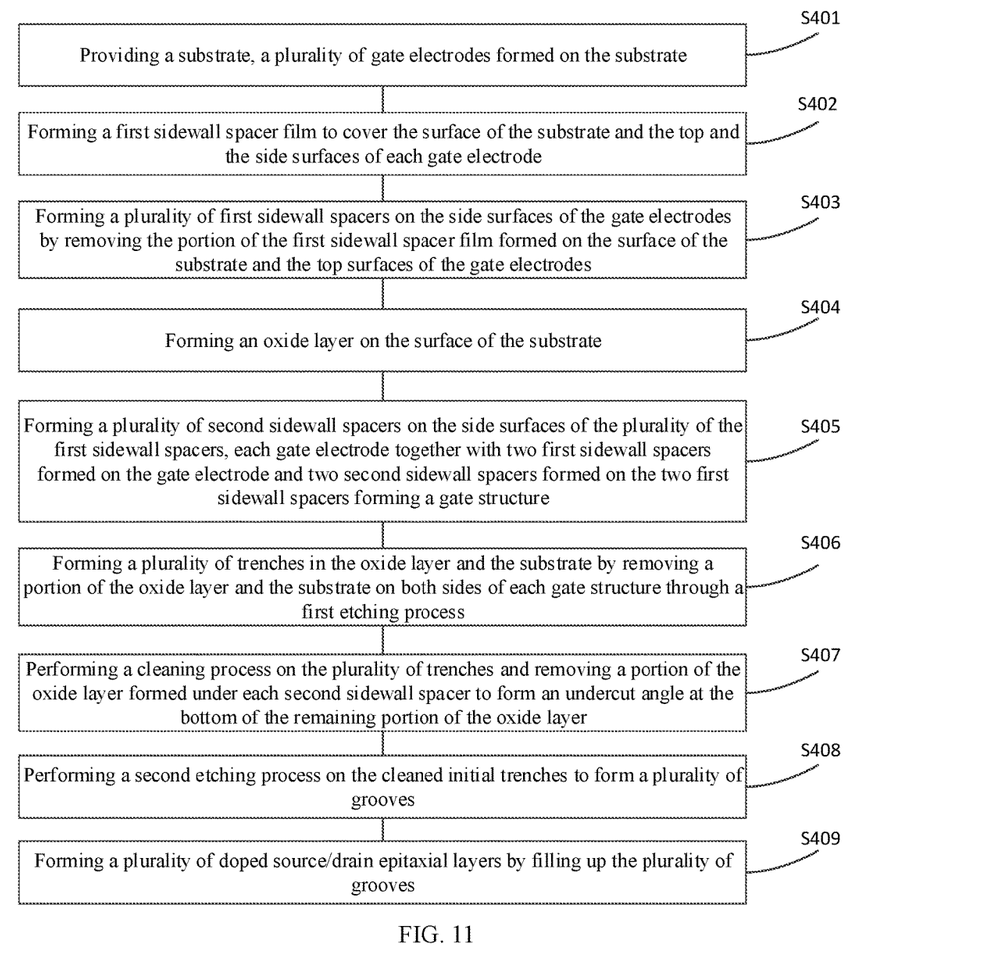
FIG. 11 illustrates a flowchart of the exemplary method for fabricating a semiconductor structure consistent with various embodiments of the present disclosure.

The present disclosure provides a method for fabricating semiconductor structures. FIG. 11 illustrates a flowchart of the exemplary method for fabricating a semiconductor structure consistent with various embodiments of the present disclosure. FIGS. 2-10 illustrate schematic views of semiconductor structures at certain stages of the fabrication method.

Figure 2:
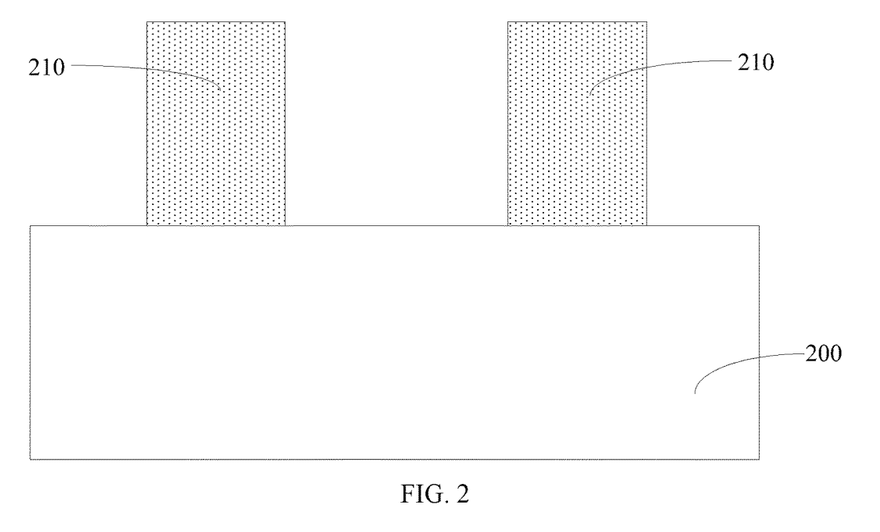
FIGS. 2-10 illustrate schematic views of semiconductor structures at certain stages of an exemplary fabrication method for a semiconductor structure consistent with various embodiments of the present disclosure.

Referring to FIG. 11, a substrate may be provided and a plurality of gate electrodes may be formed on the substrate (S401). FIG. 2 illustrates a schematic cross-section view of a semiconductor structure consistent with some embodiments of the present disclosure.

Referring to FIG. 2, a substrate 200 may be provided, and a plurality of gate electrodes 210 may be formed on the substrate 200. For illustration purpose, referring to FIG. 2, the semiconductor structure is described to have two gate electrodes 210 formed on the substrate 200.

In one embodiment, the substrate 200 may be used to form a plurality of P-type metal-oxide-semiconductor (PMOS) transistors, and accordingly, the semiconductor structure to be formed may be a PMOS device. In some other embodiments, the substrate may be used to form both PMOS transistors and N-type metal-oxide-semiconductor (NMOS) transistors. Alternatively, in other embodiments, the substrate may be used to form a plurality of NMOS transistors.

In one embodiment, the substrate 200 may be made of silicon. In some other embodiments, the substrate may be made of germanium, SiGe, SiC, GaAs, InAs, or any other appropriate semiconductor material. Alternatively, the substrate may be made of silicon on insulator (SOI), germanium on insulator (GOI), or any other composite semiconductor structure.

In one embodiment, each of the gate electrodes 210 may include a polycrystalline-silicon gate electrode or a metal gate electrode.

In one embodiment, the plurality of gate electrodes 210 may be formed by a process including the following steps. First, a gate electrode film may be formed on the substrate 200. A hard mask layer may then be formed on the gate electrode film. A pattern of the hard mask layer may define the positions and the dimensions of the plurality of gate electrodes 210 to be formed. The gate electrode film may be etched using the hard mask layer as an etch mask to form the plurality of gate electrodes 210. After forming the plurality of gate electrodes 210, the hard mask layer may be removed.

Figure 3:
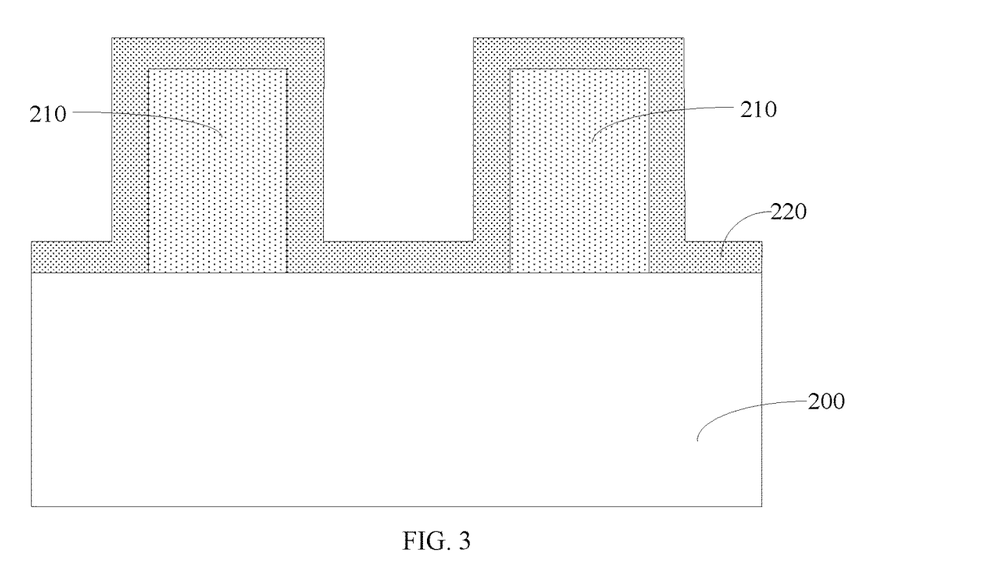

Further, returning to FIG. 11, a first sidewall spacer film may be formed to cover the surface of the substrate as well as the top and the side surfaces of each gate electrode (S402). FIG. 3 illustrates a schematic cross-section view of a semiconductor structure consistent with some embodiments of the present disclosure.

Referring to FIG. 3, a first sidewall spacer film 220 may be formed on the substrate 200. The first sidewall spacer film 220 may cover the top and the side surfaces of each gate electrode 210 and also cover the surface of the substrate 200.

In one embodiment, the first sidewall spacer film 220 may be made of a nitride including one or more of $SiN_x$, SiCN, SiBN, etc. The process to form the first sidewall spacer film 220 may be a chemical vapor deposition (CVD) process, an atomic layer deposition (ALD) process, or any other appropriate deposition process.

Figure 4:
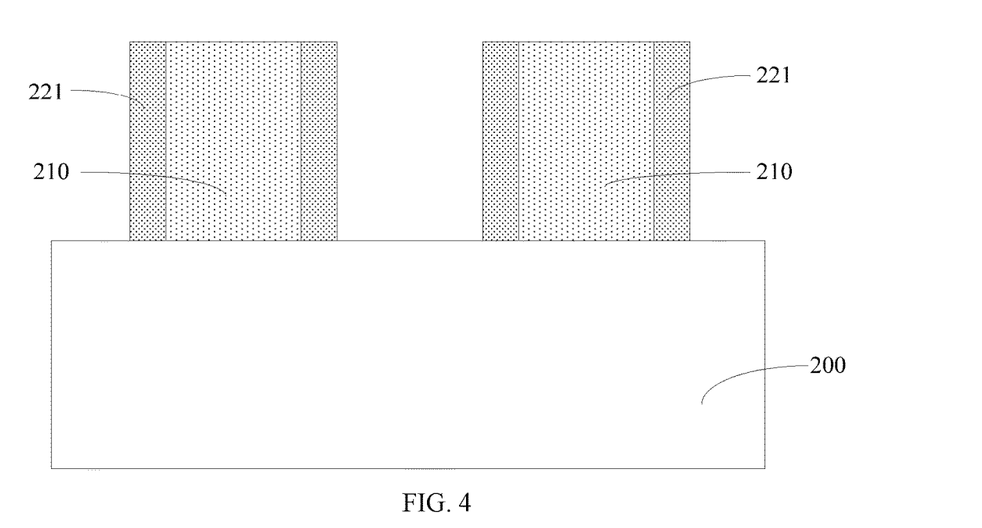

Further, returning to FIG. 11, the portion of the first sidewall spacer film formed on the top surfaces of the gate electrodes and the surface of the substrate may be removed to form a plurality of first sidewall spacers on the side surfaces of the plurality of gate electrodes (S403). FIG. 4 illustrates a schematic cross-section view of a semiconductor structure consistent with some embodiments of the present disclosure.

Referring to FIG. 4, the portion of the first sidewall spacer film 220 (referring to FIG. 3) formed on the top surface of the each gate electrode 210 and the surface of the substrate 200 may be removed. As such, the remaining portion of the first sidewall spacer film 220 that covers the side surfaces of the plurality of gate electrodes 210 may become a plurality of first sidewall spacers 221.

In one embodiment, the plurality of first sidewall spacers 221 may be used to define the positions of a plurality of doped source/drain epitaxial layers formed in a subsequent process. The plurality of the first sidewall spacers 221 may be made of a nitride including one or more of $SiN_x$, SiCN, SiBN, etc.

In one embodiment, the process to remove the portion of the first sidewall spacer film 220 formed on the top surface of each gate electrode 210 and the surface of the substrate 200 may be a dry etching process.

Figure 5:
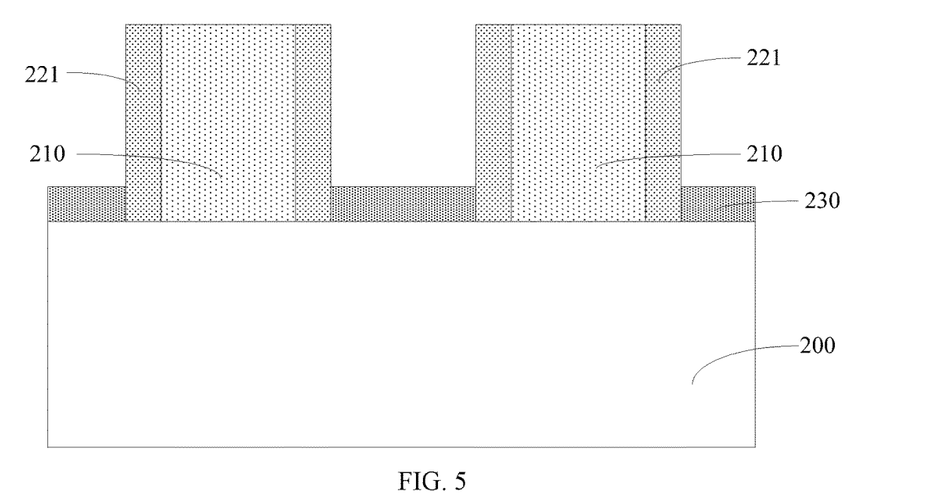

Further, returning to FIG. 11, an oxide layer may be formed on the surface of the substrate (S404). FIG. 5 illustrates a schematic cross-section view of a semiconductor structure consistent with some embodiments of the present disclosure.

Referring to FIG. 5, after forming the plurality of first sidewall spacers 221, an oxide layer 230 may be formed on the substrate 200.

In one embodiment, the oxide layer 230 may be made of a material different form the material used to form the plurality of first sidewall spacers 221. For example, the plurality of the first sidewall spacers 221 may be made of a nitride, and the oxide layer 230 may be made of silicon oxide.

In one embodiment, the thickness of the oxide layer 230 may not be too large or too small. When the thickness of the oxide layer 230 is too large, during an etching process performed subsequently on the semiconductor structure, the angle of the etch direction with respect to the normal direction of the surface of the substrate 200 may be small, resulting in an insufficient stress induced by subsequently-formed grooves. As such, a large thickness of the oxide layer 230 may not be conducive to reducing the resistance of the subsequently-formed doped source/drain epitaxial layers. However, when the thickness of the oxide layer 230 is too small, the fabrication process may be more difficult. Therefore, in one embodiment, the thickness of the oxide layer 230 may be in a range of approximately 20 Å to 30 Å.

In one embodiment, the oxide layer 230 may be formed by an oxidation growth process. By using an oxidation growth process to form the oxide layer 230 on the portion of the substrate 200 exposed by the plurality of first sidewall spacers 221, the fabrication process may be simplified. In other embodiments, the oxide layer may be formed by a deposition process such as CVD, ALD, etc.

Figure 6:
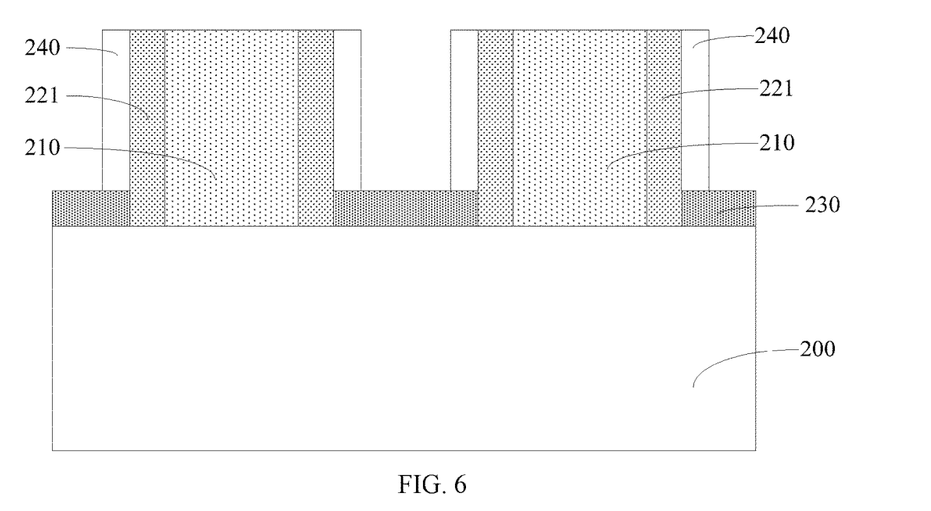

Further, returning to FIG. 11, a plurality of second sidewall spacers may be formed on the side surfaces of the plurality of first sidewall spacers (S405). FIG. 6 illustrates a schematic cross-section view of a semiconductor structure consistent with some embodiments of the present disclosure.

Referring to FIG. 6, a second sidewall spacer 240 may be formed on each first sidewall spacer 221. As such, each gate electrode 210 together with two first sidewall spacers 221 and two second sidewall spacers 240 may form a gate structure (not labeled).

In one embodiment, the plurality of second sidewall spacers 240 and the plurality of first sidewall spacers 221 may both serve to define the positions of the plurality of subsequently-formed doped source/drain epitaxial layers.

In one embodiment, each gate structure may have a multi-layer structure formed by the gate electrode 210, the first sidewall spacers 221, and the second sidewall spacers 240. The second sidewall spacers 240 may be made of a nitride including one or more of $SiN_x$, SiCN, SiBN, etc.

In one embodiment, the thickness of the second sidewall spacers 240 may not be too large or too small. When the thickness of the second sidewall spacers 240 is too large, the distance between neighboring gate structures may be too small, and thus the semiconductor structure may not meet the dimension requirements. When the thickness of the second sidewall spacers 240 is too small, the stress induced by the subsequently-formed grooves may be undesirably small. Therefore, in one embodiment, the thickness of the second sidewall spacers 240 may be in a range of approximately 100 Å to 180 Å.

Figure 7:
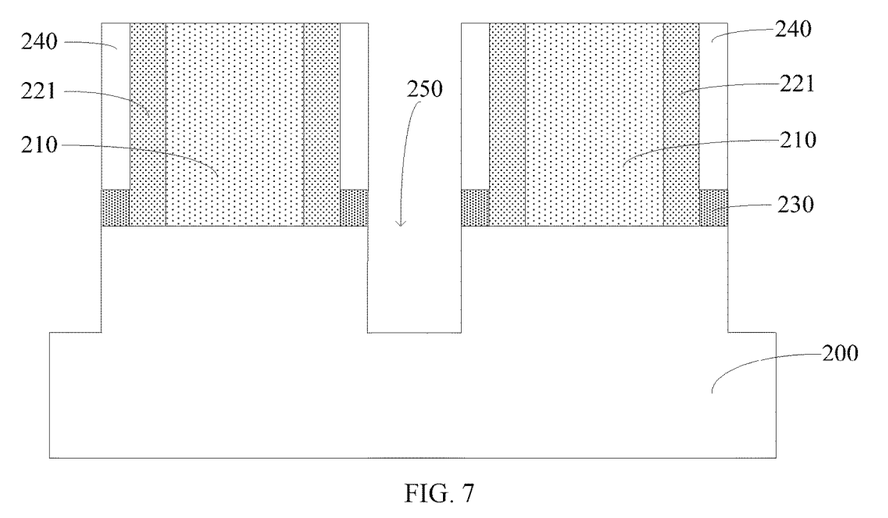

Further, returning to FIG. 11, a plurality of trenches may be formed in the oxide layer and the substrate by removing a portion of the oxide layer and the substrate on both sides of each gate structure through a first etching process (S406). FIG. 7 illustrates a schematic cross-section view of a semiconductor structure consistent with some embodiments of the present disclosure.

Referring to FIG. 7, a first etching process may be performed to remove a portion of the oxide layer 230 and the substrate 200 on both sides of each gate structure. As such, a plurality of trenches 250 may be formed in the oxide layer 230 and the substrate 200 on both sides of each gate structure.

In one embodiment, the cross section of each trench 250 may have a rectangular shape. In other embodiments, the cross section of the trench 250 may have a "Y" shape or a squared shape.

In one embodiment, the first etching process may be a dry etching process.

Figure 8:
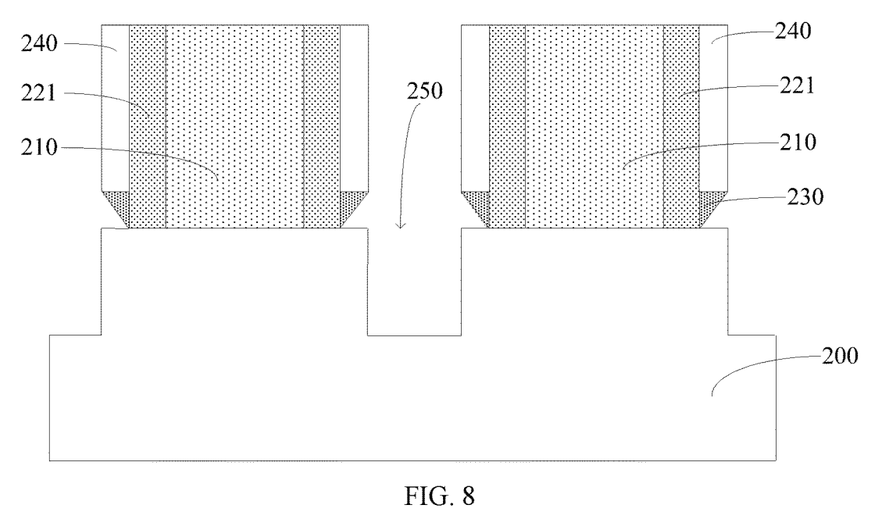

Further, returning to FIG. 11, a cleaning process may be performed on the plurality of trenches, and a portion of the oxide layer formed under each second sidewall spacer may be removed to form an undercut angle at the bottom of the remaining portion of the oxide layer (S407). FIG. 8 illustrates a schematic cross-section view of a semiconductor structure consistent with some embodiments of the present disclosure.

Referring to FIG. 8, the plurality of trenches 250 may be cleaned by a cleaning process, and a portion of the oxide layer 230 formed under each second sidewall spacer 240 may be removed. As such, an undercut angle may be formed at the bottom of the remaining portion of the oxide layer 230 under each second sidewall spacer 240. That is, in a direction from the bottom of the second sidewall spacer 240 to the surface of the substrate 200, the width of the cross section of the remaining portion of the oxide layer 230 under each second sidewall spacer 240 may gradually decrease.

In one embodiment, by removing the portion of the oxide layer 230 to form the undercut angle at the bottom of the remaining portion of the oxide layer 230, the stress induced by a subsequently-formed groove may be sufficiently large. In addition, cleaning the trench 250 may also be able to remove the impurities from the trench 250. Therefore, the cleanliness of the trench 250 may be improved, and thus the quality of a subsequently-formed groove may also be improved. Further, because a doped source/drain epitaxial layer may then be formed in the groove in a subsequent process, the quality of the doped source/drain epitaxial layer may be improved.

In one embodiment, during the cleaning process performed on the plurality of trenches 250, a diluted HF solution may be used to clean the trenches 250. The diluted HF solution may further remove a portion of the oxide layer 230 formed under each second sidewall spacer 240 so that a portion of the surface of the substrate 200 under the second sidewall spacer 240 may be exposed due to the partial removal of the oxide layer 230. The exposed portion of the surface of the substrate 200 under each second sidewall spacer 240 may provide a process basis for a subsequently-performed second etching process.

Further, returning to FIG. 11, the cleaned trenches may be further etched by a second etching process to form a plurality of grooves (S408). FIG. 9 illustrates a schematic cross-section view of a semiconductor structure consistent with some embodiments of the present disclosure.

Referring to FIG. 9, after performing the cleaning process, a second etching process may be performed on the trenches 250 to form a plurality of grooves 260.

In one embodiment, the cross section of each groove 260 may have a "Y" shape. In other embodiments, the cross section of the groove 260 may have a rectangular shape or a squared shape.

In one embodiment, because a portion of the oxide layer 230 formed under each second sidewall spacer 240 is removed and an undercut angle is formed at the bottom of the remaining portion of the oxide layer 230, the groove 260 formed after the second etching process may be able to introduce a large stress. Moreover, because the position of the formed groove 260 is next to the corresponding second sidewall spacer 240, the distance from the groove 260 to the corresponding channel of the semiconductor structure may be small. Therefore, the disclosed fabrication method may reduce the resistance of the subsequently-formed doped source/drain epitaxial layers, and thus the electrical performance of the semiconductor structure may be improved.

In one embodiment, the second etching process may be a wet etching process.

Further, returning to FIG. 11, a plurality of doped source/drain epitaxial layers may be formed to fill the plurality of grooves (S409). FIG. 10 illustrates a schematic cross-section view of a semiconductor structure consistent with some embodiments of the present disclosure.

Referring to FIG. 10, a plurality of doped source/drain epitaxial layers 270 may be formed by filling up the plurality of grooves 260. In one embodiment, because the groove 260 may be able to induce a large stress and the distance from each groove 260 to the corresponding channel of the semiconductor structure may also be small, the resistance of the doped source/drain epitaxial layers 270 may be reduced. Therefore, the electrical performance of the semiconductor structure may be improved.

In one embodiment, the substrate 200 is a substrate used to form PMOS transistors. Accordingly, the plurality of doped source/drain epitaxial layers 270 may be made of SiGe. The doped source/drain epitaxial layer 270 may provide a compressive stress to the channel and may also improve the mobility of charge carriers in the PMOS device.

Moreover, the present disclosure also provides a semiconductor structure. FIG. 9 illustrates a schematic cross-section view of a semiconductor structure consistent with some embodiments of the present disclosure.

Referring to FIG. 9, the semiconductor structure may include a substrate 200, a plurality of gate electrodes 210 formed on the substrate 200, a plurality of first sidewall spacers 221 formed on both side surfaces of each gate electrode 210, and an oxide layer 230 formed on a portion of the surface of the substrate 200 between first sidewall spacers 221 of adjacent gate electrodes, and a plurality of second sidewall spacers 240 formed on the oxide layer 230 and covering the side surfaces of the plurality of first sidewall spacers 221. The bottom of the portion of the oxide layer 230 under each second sidewall spacer 240 may form an undercut angle. That is, in a direction from the bottom of the second sidewall spacer 240 to the surface of the substrate 200, the width of the cross section of the portion of the oxide layer 230 under each second sidewall spacer 240 may gradually decrease. Moreover, each gate electrode 210 together with two first sidewall spacers 221 and two second sidewall spacers 240 may form a gate structure (not labeled). The semiconductor structure may also include a plurality of grooves 260 formed in the oxide layer 230 and the substrate 200 on both sides of each gate structure.

In one embodiment, the groove 260 may induce a large stress and the distance from the groove 260 to the channel of the semiconductor structure may be small, the resistance of a subsequently-formed doped source/drain epitaxial layer may be small. Therefore, the electrical performance of the semiconductor structure may be improved.

In one embodiment, the oxide layer 230 and the first sidewall spacer 221 may be made of different materials. For example, the oxide layer 230 may be made of silicon oxide and the plurality of first sidewall spacers 221 may be made of a nitride.

Compared to conventional semiconductor structures and fabrication methods, the disclosed semiconductor structures and fabrication methods may demonstrate several advantages.

According to the disclosed semiconductor structures and fabrication methods, at the beginning of the fabrication process, two first sidewall spacers are formed on the side surfaces of each gate electrode. After forming the first sidewall spacers, an oxide layer is then formed on the substrate. Further, a second sidewall spacer may be formed on the side surface of each first sidewall spacer. The gate electrode, the first sidewall spacers, and the second sidewall spacers may together form a gate structure. Because the oxide layer is formed after forming the first sidewall spacers and prior to forming the second sidewall spacers, a portion of the oxide layer is thus located between the substrate and the bottom of each second sidewall spacer. During the process to form the plurality of grooves, a portion of the oxide layer and the substrate on both sides of each gate structure needs to be removed. Because of the selective etching effect, the first sidewall spacers and the second sidewall spacers are not removed during the etching process, and the oxide layer and the substrate are partially removed. Because the oxide layer between the substrate and the bottom of each second sidewall spacer is partially removed and an undercut angle is formed at the bottom of the remaining portion of the oxide layer, the groove formed after the etching process is able to induce a large stress. Moreover, because the distance from the groove to the channel of the semiconductor structure is small, the resistance of a doped source/drain epitaxial layer formed by filling the groove in a subsequent process may be small. Therefore, the electrical performance of the semiconductor structure may be improved.

Further, according to the disclosed semiconductor structure and fabrication methods, the thickness of the oxide layer may be in a range of approximately 20 Å to 30 Å. Controlling the thickness of the oxide layer in a reasonable range ensure a relatively large stress induced by the groove, and in the meantime, may also allow a relatively small distance from the groove to the channel of the semiconductor structure. When the thickness of the oxide layer is overly large, the stress induced by the groove may be too small, and thus may not be conductive to reducing the resistance of the subsequently-formed doped source/drain epitaxial layer. When the thickness of the oxide layer is too small, the fabrication process may be more difficult.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a substrate;
   a plurality of gate electrodes formed on the substrate;
   a plurality of first sidewall spacers formed on side surfaces of each gate electrode;
   an oxide layer formed on the substrate between first sidewall spacers of adjacent gate electrodes, wherein an undercut is formed at a bottom of the oxide layer having an undercut angle with the substrate;
   a plurality of second sidewall spacers, formed on the oxide layer and covering side surfaces of the plurality of first sidewall spacers, wherein each gate electrode, first sidewall spacers formed on the side surfaces of the gate electrode, and second sidewall spacers formed on the side surfaces of the first sidewall spacers together form a gate structure, the undercut angle is made between a bottom surface of the oxide layer and a top surface of the substrate under each second sidewall spacer and a common edge of the undercut angle being coincided with a common edge between the side surface of each first sidewall spacer and the top surface of the substrate; and
   a plurality of grooves formed in the oxide layer and the substrate, wherein each groove includes undercuts under second sidewall spacers of adjacent gate structures.

2. The semiconductor structure according to claim 1, wherein:
   a cross section of each groove has a "Σ" shape.

3. The semiconductor structure according to claim 1, further including:
   a plurality of doped source/drain epitaxial layers formed in the plurality of grooves.

4. The semiconductor structure according to claim 1, wherein:
   the oxide layer is made of silicon oxide.

5. The semiconductor structure according to claim 4, wherein:
   a thickness of the oxide layer is in a range of approximately 20 Å to 30 Å.

6. The semiconductor structure according to claim 1, wherein:
the plurality of first sidewall spacers and the plurality of second sidewall spacers are made of a nitride including one or more of $SiN_x$, SiCN, and SiBN.

7. The semiconductor structure according to claim 6, wherein:
a thickness of each second sidewall spacer is in a range of approximately 100 Å to 180 Å.

8. A method for fabricating a semiconductor structure, comprising:
providing a substrate;
forming a plurality of gate electrodes on the substrate;
forming a plurality of first sidewall spacers on side surfaces of the plurality of gate electrodes;
forming an oxide layer on the substrate after forming the plurality of first sidewall spacers;
forming a plurality of second sidewall spacers on the oxide layer covering side surfaces of the plurality of first sidewall spacers, wherein each gate electrode, first sidewall spacers formed on the side surfaces of the gate electrode, and second sidewall spacers formed on the side surfaces of the first sidewall spacers together form a gate structure;
forming an undercut, having an undercut angle made between a bottom surface of the oxide layer and a top surface of the substrate under each second sidewall spacer, a common edge of the undercut angle being coincided with a common edge between the side surface of each first sidewall spacer and the top surface of the substrate; and
forming a plurality of grooves through the oxide layer and into the substrate, wherein each groove includes undercuts under second sidewall spacers of adjacent gate structures.

9. The method according to claim 8, wherein:
a cross section of each groove has a "Σ" shape.

10. The method according to claim 1, after forming the plurality of grooves, further including:
forming a plurality of doped source/drain epitaxial layers by filling up the plurality of trenches.

11. The method according to claim 1, wherein:
the oxide layer is formed after the plurality of first sidewall spacers are formed and before the plurality of second sidewall spacers are formed.

12. The method according to claim 8, wherein:
the plurality of first sidewall spacers and the plurality of second sidewall spacers are made of a nitride including one or more of $SiN_x$, SiCN, and SiBN.

13. The method according to claim 12, wherein:
a thickness of each second sidewall spacer is in a range of approximately 100 Å to 180 Å.

14. The method according to claim 8, wherein:
the oxide layer is made of silicon oxide.

15. The method according to claim 14, wherein:
a thickness of the oxide layer is in a range of approximately 20 Å to 30 Å.

16. The method according to claim 15, wherein:
the oxide layer is formed by an oxidation growth process, a chemical vapor deposition (CVD) process, or an atomic layer deposition (ALD) process.

17. The method according to claim 1, wherein forming the undercut and forming the plurality of grooves include:
forming a plurality of trenches by performing a first etching process on the oxide layer and the substrate between adjacent gate structures;
performing a cleaning process on the plurality of trenches and removing a portion of the oxide layer formed under each second sidewall spacer to form the undercut at the bottom of the oxide layer under each second sidewall spacer; and
performing a second etching process on the trenches to form the plurality of grooves.

18. The method according to claim 17, wherein:
the first etching process is a dry etching process.

19. The method according to claim 17, wherein performing the cleaning process includes:
using a diluted HF solution to clean the plurality of trenches.

20. The method according to claim 17, wherein:
the second etching process is a wet etching process.

* * * * *